United States Patent [19]
Griess

[11] 3,986,047

[45] Oct. 12, 1976

[54] RAMP RELEASE AND RESET CIRCUIT FOR A THREE PHASE VOLTAGE REGULATOR

[75] Inventor: Roy K. Griess, Wappingers Falls, N.Y.

[73] Assignee: International Business Machines Corporation, Armonk, N.Y.

[22] Filed: Dec. 22, 1975

[21] Appl. No.: 643,441

[52] U.S. Cl. .............................. 307/228; 307/215; 307/269; 323/24; 328/181
[51] Int. Cl.² ......................................... H03K 4/08
[58] Field of Search ........ 307/228, 229, 269, 252 B, 307/252 T, 215; 328/181–185; 323/24

[56] References Cited
UNITED STATES PATENTS

| | | | |
|---|---|---|---|
| 3,514,639 | 5/1970 | Gundlach et al. | 307/228 |
| 3,624,486 | 11/1971 | Oates | 321/18 |
| 3,735,241 | 5/1973 | O'Sullivan | 323/24 |

Primary Examiner—Stanley D. Miller, Jr.
Attorney, Agent, or Firm—Harold H. Sweeney, Jr.

[57] ABSTRACT

An improved ramp control circuit is provided for use in a three phase, SCR phase controlled, voltage regulator. Two, 180° out of phase timing pulses are generated in a pair of comparators for each phase of the three phase input to the system. The comparator switching point is raised above the zero crossover point on each phase input by a voltage offset associated with each comparator. A logical circuit is driven by the predetermined combinations of the 180° out of phase timing pulses from each of the pair of comparators to produce ramp timing pulses at each output of the logic circuit in accordance with the logic in the logical circuit. Each ramp timing pulse is utilized to generate a linear ramp, released and reset by the beginning and end, respectively, of each of said ramp timing pulses.

9 Claims, 9 Drawing Figures

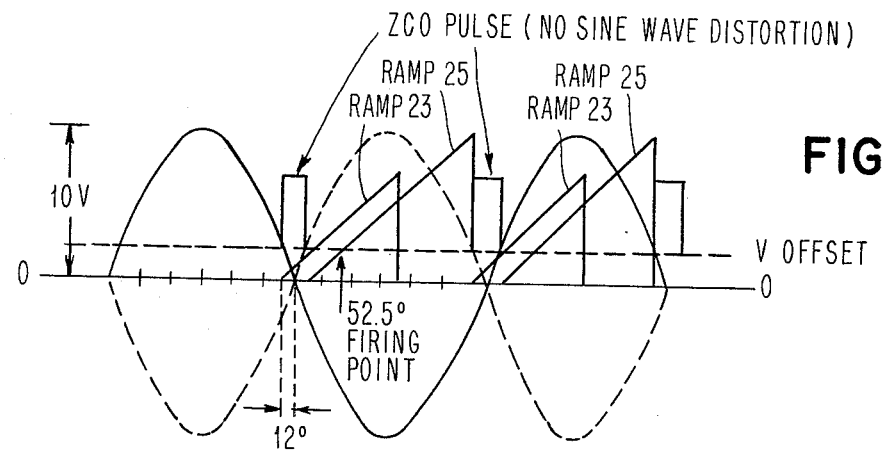
FIG. 2a
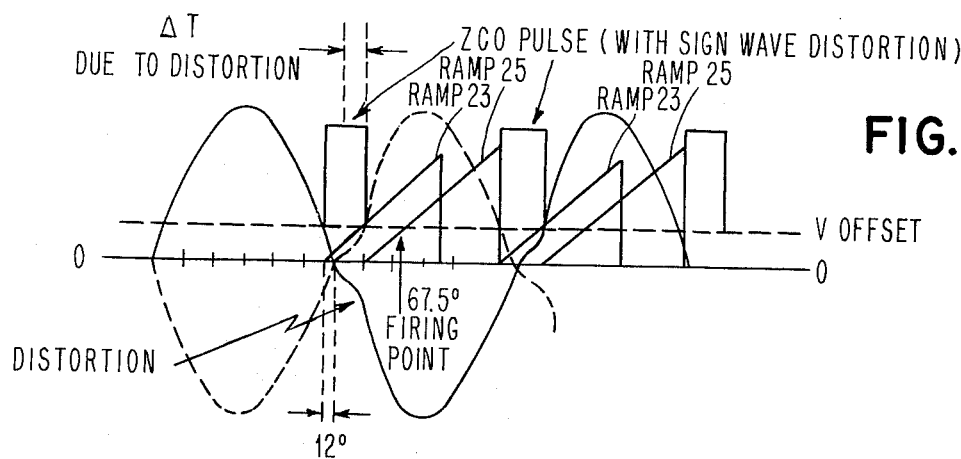
FIG. 2b
FIG. 3
PRIOR ART
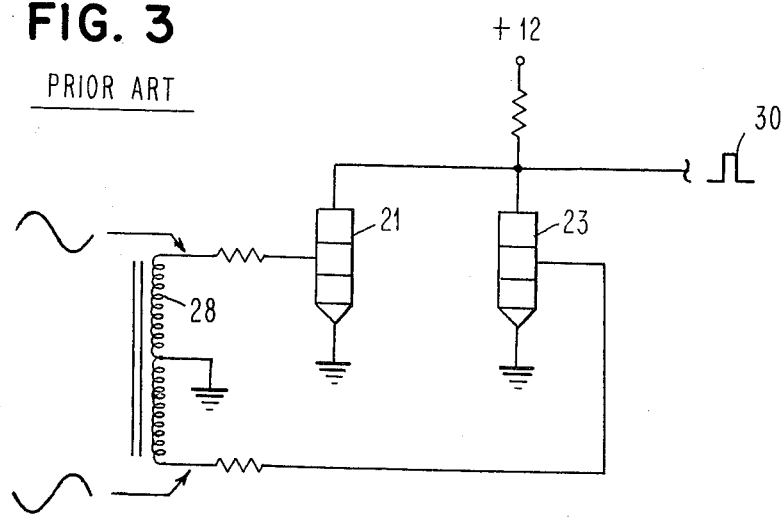

RAMP RELEASE AND RESET (LOGIC FUNCTION)

RAMP RELEASE AND RESET CIRCUIT FOR A THREE PHASE VOLTAGE REGULATOR

BACKGROUND OF THE INVENTION

Statement of the Invention

This invention relates to a ramp release and reset circuit and, more particularly, to a logical ramp release and reset circuit for a three phase, SCR phase controlled, voltage regulator which is relatively free of timing variations due to motor/generator wave distortion.

Ramp release and reset circuits have introduced timing variations in the ramp generated because of distortion in the input waves. For example, the three phase silicon controlled rectifier (SCR) voltage controlled regulators used extensively in the computer industry have been found to contain voltage variations due to the distortion in the sinusoidal wave inputs from motor generator sets when large load changes occur. The motor generator sets have been found to produce distortion in their output which is somewhat proportional to current load. This distortion in turn, as mentioned above, causes the ramp release and reset circuit output to vary in time, thereby generating a ramp having an unstable release and start time. The firing angle is determined by the time the ramp crosses the error voltage. A pulse is produced at the intersection of the two voltages which is used to trigger the gate of the silicon controlled rectifier (SCR), thereby turning it on. The prior art ramp release and reset circuits consist of what are popularly known as zero crossover circuits which produce a short pulse at the zero crossover point on the input sinewave. The ramp is released at the end of a pulse and is reset at the beginning of the next pulse. Thus, the ramp when compared to a particular voltage level should give a consistent firing angle output. However, this output is not consistent since the ramps tend to have different starting times because of the varying width of the zero crossover pulses and, accordingly, cross the error voltage at different points. The zero crossover pulses, as previously mentioned, vary in width because of the distortion in the sinewave which is utilized to generate the zero crossover pulse.

SUMMARY OF THE INVENTION

It is the main object of the present invention to provide a ramp release and reset circuit which is substantially unaffected by distortion in the generating sinewave.

It is another object of the present invention to provide an improved ramp release and reset circuit which is a logic circuit based on a predetermined logical function.

It is another object of the present invention to provide a ramp release and reset circuit in which the ramp release and reset timing pulses are generated at the crossover point between the sinewave and an offset voltage where the sinewave is only approaching the zero crossover line.

Briefly, an improved ramp release and reset circuit is provided for a three phase voltage regulation system, which includes a pair of comparators for each phase of the three phase input to the system for generating two 180° out of phase timing pulses for each phase. A voltage offset means is included associated with each comparator, which raises the comparator switching point above the zero crossover point on each phase input. A logical circuit is driven by the predetermined combination of the 180° out of phase timing pulses from each of the pair of comparators to produce ramp timing pulses at each output of the logic circuit in accordance with the logic in the logical circuit. A linear ramp generator, one associated with each of the logical circuit outputs, generates linear ramps released and reset by the beginning and end, respectively, of each of said ramp timing pulses.

BRIEF DESCRIPTION OF THE DRAWINGS

FIG. 2a is a schematic diagram showing the conventional zero crossover pulse and ramp generated thereby and the ramp generated by the logic circuit superimposed on the sinewave input when there is no distortion.

FIG. 2b is a schematic representation showing the zero crossover pulse, the resulting ramp and the ramp generated by the logic circuit superimposed on a sinewave arrangement in which there is distortion.

FIG. 3 is a schematic circuit diagram showing the zero crossover circuit of the prior art.

DETAILED DESCRIPTION OF THE PREFERRED EMBODIMENT OF THE INVENTION

Figure 1:
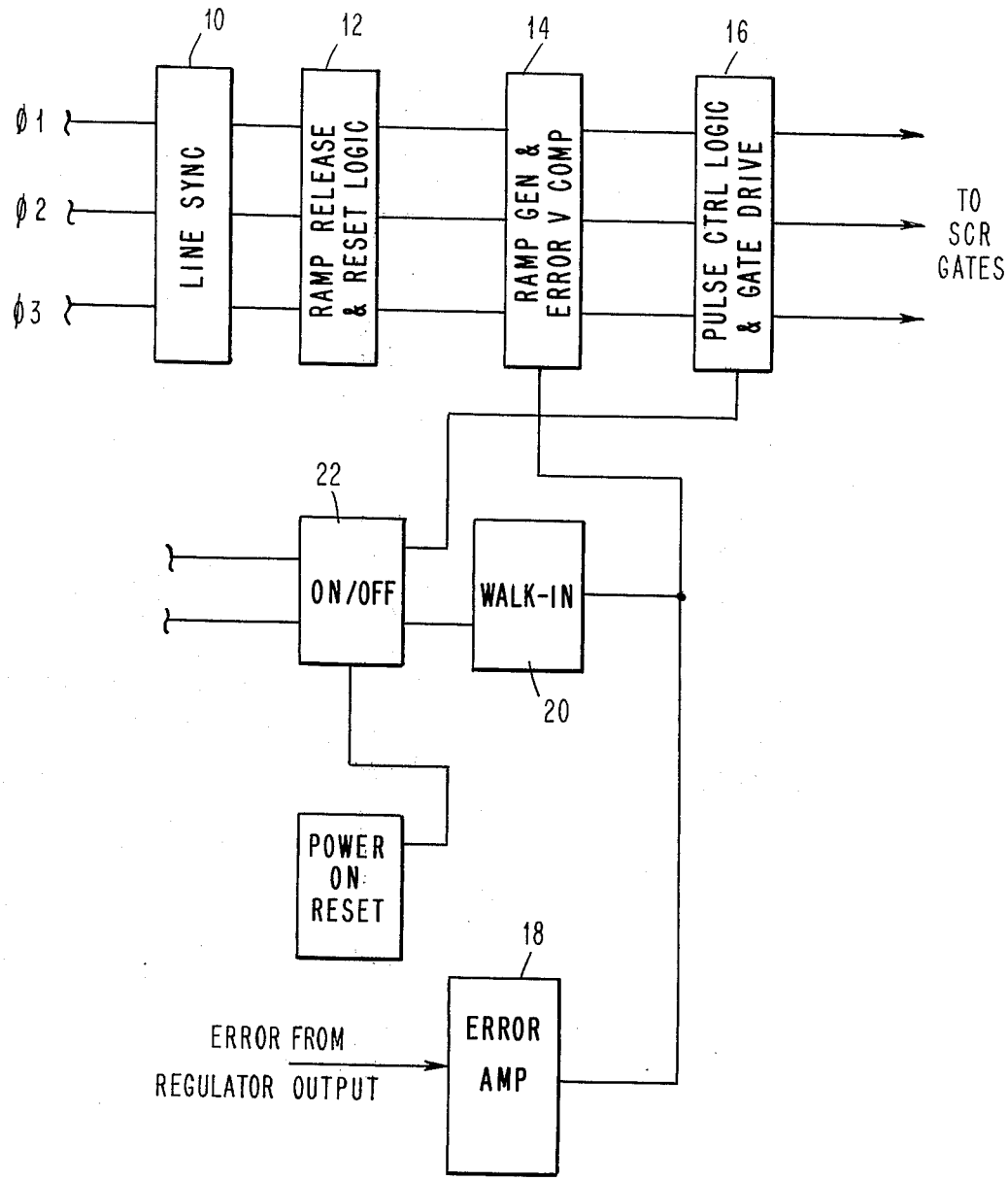
FIG. 1 is a block diagram of the timing and control circuitry for a phase controlled regulator.

Referring to FIG. 1, there is shown the timing and control block diagram for a phase controlled regulator which includes the ramp release and reset logic circuit of the present invention. The regulator is a three phase SCR (Silicon Control Rectifier) regulator, which receives the three phase inputs from an input transformer at the line synchronizer 10 which essentially synchronizes the three phase signals so as to have the proper timing relationship with respect to one another. The three phase outputs from the line synchronizer 10 are connected to the ramp release and reset logic circuit 12 of the present invention. This circuit 12 generates the control or timing pulses for generating a ramp which is relatively independent of the distortion which may exist on the input sinewaves 01, 02 and 03. The motor generator sets (not shown) used as the power source produce a sinusoidal varying voltage in which the distortion appears to be proportional to the load current. Part of the distortion occurs in the zero crossover area of the sinewave, thus, adversely impacting the accuracy of the zero crossover detector. The purpose of the ramp release and reset logic is to control the start and stop or release and reset of a ramp. It will be appreciated that if the ramp starts at different points, it crosses an offset line which may represent an error voltage at different distances along the error voltage line. For example, the ramp generated in the regulator is compared with a feedback error voltage obtained from the output of the regulator. A pulse is generated at the intersection of the ramp and the error voltage. The distance along the time axis, which is the zero line of the ramp, is known as the firing angle, since the pulse thereby generated is used to fire the silicon control rectifiers through their gates. This pulse generated in the ramp generator and error voltage comparator 14 is sent to the pulse control logic gate drive circuit 16 where the timing pulse for the SCR gate is generated. The variations of the output voltage of the regulator are sensed and utilized to develop an error signal which is amplified in error amplifier 18 and used as the error voltage in the ramp generator and error voltage comparator 14. It should be appreciated, that as the error voltage becomes more positive, the firing angle increases since the intersection of the ramp and the error voltage is further up on the ramp. This causes the firing angle to increase which causes the SCRs to conduct later in the sinewave. This reduces the output voltage and is called phasing back. A decreasing error voltage fires the SCRs earlier and increases the output voltage. This is known as phasing forward. The walk-in circuit 20 prevents the regulator from turning on abruptly by initially clamping the error voltage positive and slowly reducing the error voltage during turn-on until it finds its own regulating level. The on/off function 22 controls the gate drive and walk-in circuits. Upon turn-on, the SCR gate pulses are applied immediately and slowly phased forward by the walk-in circuit. Turn-off immediately inhibits the gate pulses, and via the walk-in circuit, forces a fast phase back.

FIG. 2a shows the ramp 23 generated by the logical ramp release and reset circuit 12 of this invention along with a ramp 25 generated by the zero crossover (ZCO) circuit of the prior art. These ramps are superimposed on the voltage sinewave variations and show the zero crossover pulse utilized in generating the prior art ramps. It should be noted that the prior art ramp 25 starts or is released at the end of the ZCO pulse and is reset at the beginning of the next ZCO pulse. The firing point, that is, the point at which the ramp and the error voltage offset are shown as crossing, is indicated as being 52.5°. The sinusoidal voltage wave of FIG. 2a is shown as having no sinewave distortion. The ramp 23, which is the ramp generated using the logic release and reset circuit 12 of the present invention, starts at a point determined by the intersection of the sinewave and the voltage offset on the positive offset side of the sinewave as it approaches the zero crossover point. This ramp 23 is reset at approximately 108° which is 72° before the 180° termination of the prior art ramp 25. This early reset prevents any overlap of the ramps 23 and consequent turn-on errors. FIG. 2b shows the same prior art ramp 25 and the ramp 23 generated in the present invention superimposed on a sinusoidal voltage wave which includes sinewave distortion.

It can be seen that the sinewave distortion appears to be in the area of the zero crossover and mainly after the zero crossover. The result in the prior art is that the ZCO pulse is widened due to the distortion. This is shown by the dashlines on FIG. 2b, the distance between which is indicated as $\Delta t$, that is, the change in width of the ZCO phase from FIG. 2a to FIG. 2b due to the distortion. Since the prior art ramp 25 starts at the end of the ZCO pulse, then the ramp starts later in time for a wider pulse and, accordingly, the firing point, that is, the point where the ramp and the V offset intercept is changed and is shown in this case as 67.5°. It should be noted that ramp 23 which is generated by the logical ramp release and reset circuit 12, is not affected by the elongated ZCO pulse, since it starts at approximately 12° prior to ZCO at the crossover point between the sinewave and the V offset as the sinewave approaches zero and, consequently, is not severely affected by the distortion, which as previously mentioned, is greatest after the sinewave passes the zero crossover line. Accordingly, the main purpose of the present invention is to provide a ramp release and reset circuit 12 which is unaffected by the usual distortion in the sinusoidal varying voltage obtained from the generator. It should also be noted from FIGS. 2a and 2b, that the ramp 23 of the invention requires the 180° out of phase voltage waveform shown in dashed line form in both figures. The reason for this 180° out of phase waveform can beset be seen by examining the release point of the second ramp 23 and subsequent alternate ramps. The release point of this second ramp 23 is generated at the crossing point of the 180° out of phase sinewave and the voltage offset. This maintains the beginning of each ramp 23 at the crossover point of the voltage wave and the voltage offset on the side of the wave as it approaches the zero crossover point.

FIG. 3 shows a simplified zero crossover (ZCO) circuit as used in the prior art. The voltage waveform obtained as inputs to each of the transistors 21 and 23 is shown. It will be noticed that the base inputs to the transistors 21 and 23 are obtained from split transformer 28 and are 180° out of phase. The positive bias on the base input to transistor 23 will maintain the transistor conducting until the voltage approaches zero at which point the transistor is cut-off. Simultaneously, transistor 21 conducts until its base voltage approaches zero. It will be appreciated that the time during which both transistors 23 and 21 are cut-off, that the output pulse 30 will be produced. The length of the pulse 30 will be proportional to the time interval in which both transistors remain cut-off. The distortion in the input sinusoidal or voltage wave will affect this cut-off time and, accordingly, the length of the pulse 30. As previously mentioned, this pulse width controls the start and stop of the prior art ramp 25 and thus controls the firing point.

Figure 4:
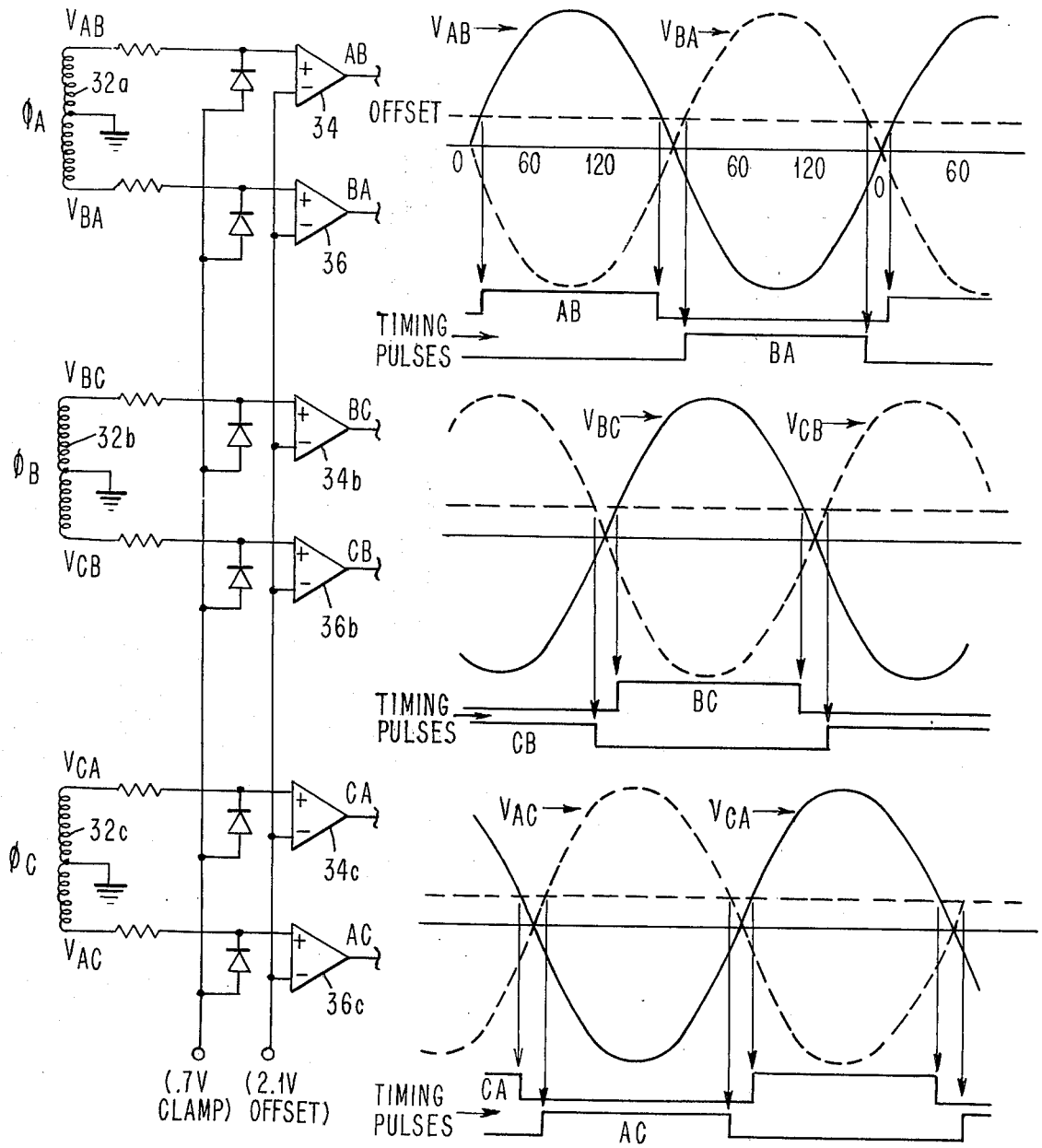
FIG. 4a is a schematic diagram showing a pair of comparators for each phase to produce the 180° out of phase timing pulses per phase.
FIG. 4b is a schematic diagram showing the out of phase, sinewave input voltages in FIG. 4a and the resulting timing pulses obtained from the comparators thereof.
Figure 5:
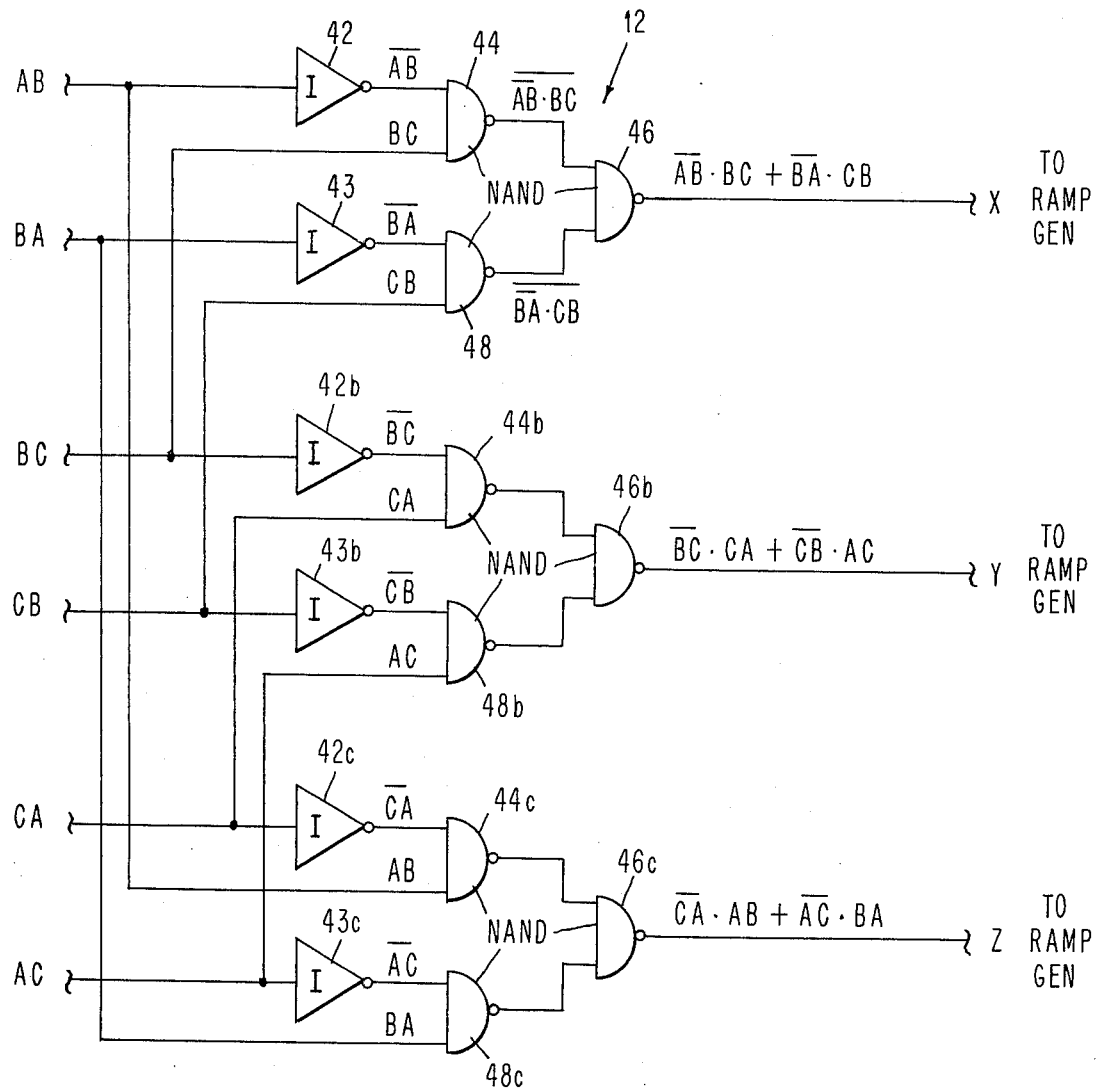
FIG. 5 is a schematic logic diagram of the ramp release and reset circuit.
Figure 6:
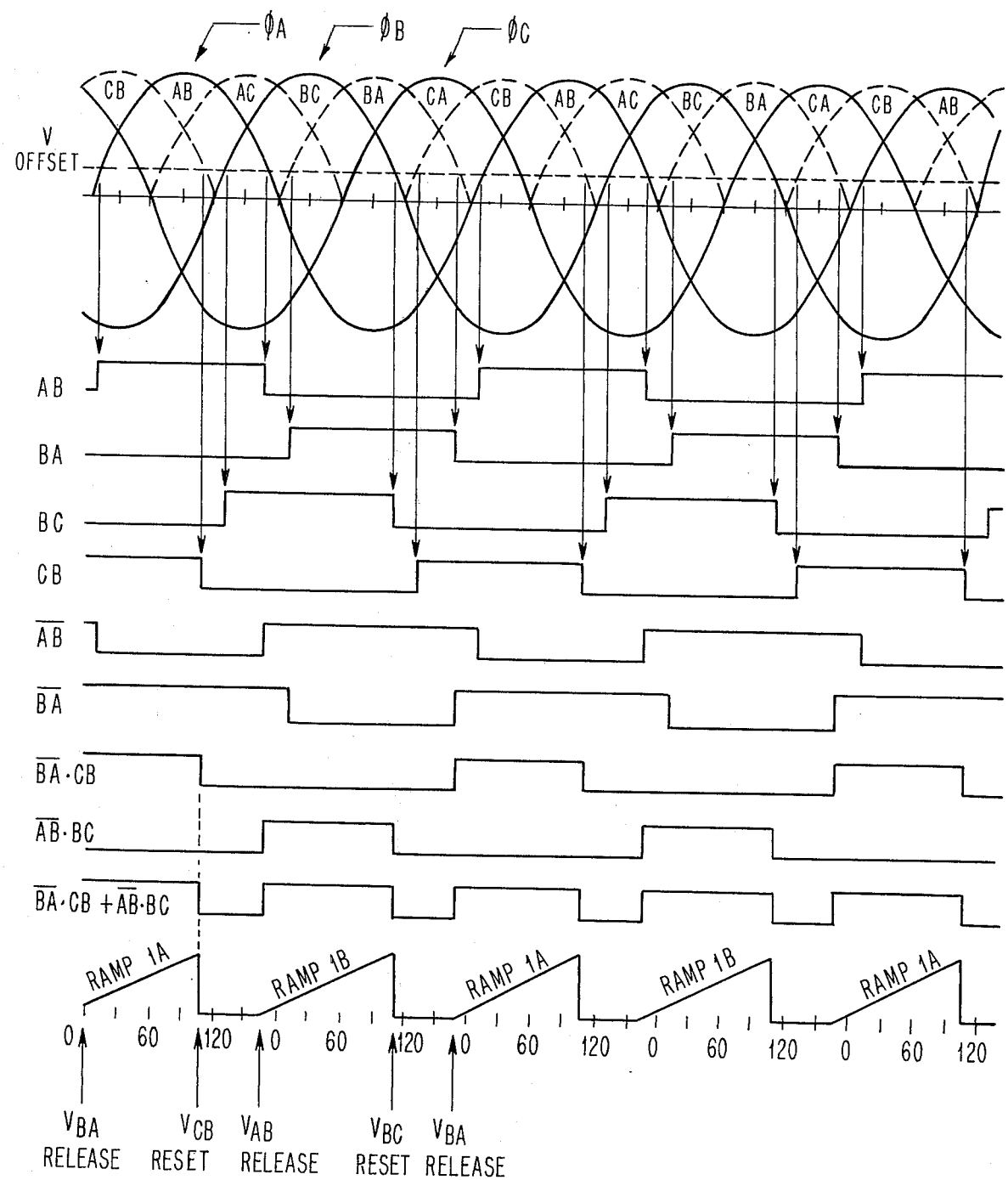
FIG. 6 is a timing chart showing the three phase sinusoidal voltage inputs and the various pulses and pulse combinations to produce the ramp timing pulses for controlling the ramps.

FIG. 4a shows the line synchronizing circuit for the present invention. $\phi A$, $\phi B$, and $\phi C$ voltage waveforms are seen coming into the transformers 32a, b and c whose outputs are the 180° out of phase sinusoidal varying voltage waveforms VAB, VBA; VBC; VCB; VCA, VAC, respectively from which the respective timing pulses will be generated. Waveforms VAB and VBA generated at opposite ends of the input transformer 31a are shown as waveforms VAB and VBA respectively in FIG. 4b. Each of the sinusoidal varying voltages VAB and VBA serve as an input to respective comparators 34, 36. The other input to each of the comparators 34, 36 is a voltage offset about which the comparison is to be made. The comparator produces the timing pulse output AB whenever the voltage VAB sinewave goes above the voltage offset which is shown in FIG. 4a as being 2.1 volts. The timing pulse AB can be seen in FIG. 4b as starting at the crossover point between the voltage offset and the sinusoidal varying voltage VAB and ending at the point at which the sinusoidal varying voltage goes below the V offset. Thus the timing pulse starts and stops at the crossover points of the VAB voltage with respect to the V offset. Similarly the timing pulse BA is generated at the points where the voltage BA crosses the same voltage offset. The input transformer 32b produces the voltage waveform VBC and the 180° out of phase voltage waveform VCB. Similarly, these are compared with the voltage offset in comparators 34b36b to produce the timing pulses BC and CB, as shown in FIG. 4b. Again, the transformer 32c for phase C produces sinusoidal varying voltage VCA and its 180° out of phase voltage VAC, both of which are compared in comparators 34c and 35c with the voltage offset to produce timing pulses CA and AC. This is schematically illustrated in the bottom waveform example of FIG. 4b showing the timing pulses CA and AC. The timing pulses AB, BA, BC, CB, CA and AC are shown forming the inputs to the ramp release and reset logic circuit 12 as shown in FIG. 5. The function of the circuit is to logically combine the input timing pulses to produce an output ramp generating pulse waveform in which the rising edge controls the ramp release and the falling edge controls the ramp reset. There is a logic function performed for each of the three phases of the three phase voltage input wherein each function is a combination of the timing pulses for two phases. More particularly, the ramp release and reset waveform for the X ramp or for $\phi 1$ is a combination of the timing pulses AB, BA and BC, CB. Similarly, the ramp release and reset waveform for generating ramp Y is a combination of the timing pulses BC, CB and CA, AC, while the third phase or Z ramp waveform is generated by a logic manipulation of the waveforms of the timing pulses CA, AC and AB, BA. The AB timing pulse, in FIG. 5, is applied to an invert circuit 42 to obtain the inverse function denoted by $\overline{AB}$. This $\overline{AB}$ pulse is utilized as one input to a NAND circuit 44 having as the other input thereto the timing pulse BC. The output of the NAND circuit is represented as $\overline{AB}.BC$. This functionally expressed pulse forms one input to a further NAND circuit 46. Similarly, the BA timing pulse is fed into an invert circuit 43 where it is inverted as represented by the functional expression $\overline{BA}$. This pulse forms one input to a NAND circuit 48 which has as the other input thereto the timing pulse CB. The resulting output is represented by the functional expression $\overline{BA}.CB$. This pulse forms the second input to the NAND circuit 46 which results in a timing pulse waveform functionally represented by the expression $\overline{AB}.BC + \overline{BA}.CB$. The functional operations of the logical ramp release and reset circuit 12 are shown in the timing chart of FIG. 6. Here the three phases, $\phi A$, $\phi B$ and $\phi C$ are represented in sinusoidal varying voltage waveforms superimposed upon one another in the correct phase relationship. The offset voltage is represented by the dotted line designated V offset. The various timing pulses AB, BA and BC, CB are shown generated at the respective times with respect to the waveforms shown. The points at which the beginning and the end of the timing pulses are formed are shown by means of arrows extending from the appropriate point on the waveform diagram. The waveform pulse $\overline{AB}$ and $\overline{BA}$ generated as a result of the invert circuit 42 and 43 are also shown. The component pulses giving rise to the resulting ramp generating waveform represented by the expression $\overline{AB}.BC$ and $\overline{BA}.CA$ are shown in FIG. 6. The logical combination or addition of these two logical expressions results in the ramp generating waveforms $\overline{BA}.CB + \overline{AB}.BC$. A schematic representation of the ramps thereby generated are also shown. These are aligned so that the release and reset points of the ramp correspond to the rising and falling edges of the generating waveform. It can be seen that the ramp 1A starts or is released at the voltage VBA and reset at the voltage VCB represented by the respective rising and falling edges of the generating waveform. Similarly, ramp 1B is released at voltage VAB which is approximately 12° before ZCO and reset at voltage VBC at about 108°. The same logical functions are performed on the BC, CB and CA, AC inputs, as shown in FIG. 5, to produce the ramp generating release and reset waveform represented by the function $\overline{BC}.CA + \overline{CB}.AC$. Again, the timing pulses CA, AC and AB, BA are functionally combined in an identical logical circuit to generate the ramp release and reset waveform $\overline{CA}.AB + \overline{AC}.BA$. The pulse waveforms are not shown in the timing chart but are timewise identically generated for $\phi B$ and $\phi C$ inputs as those shown for the $\phi A$ case.

Figure 7:
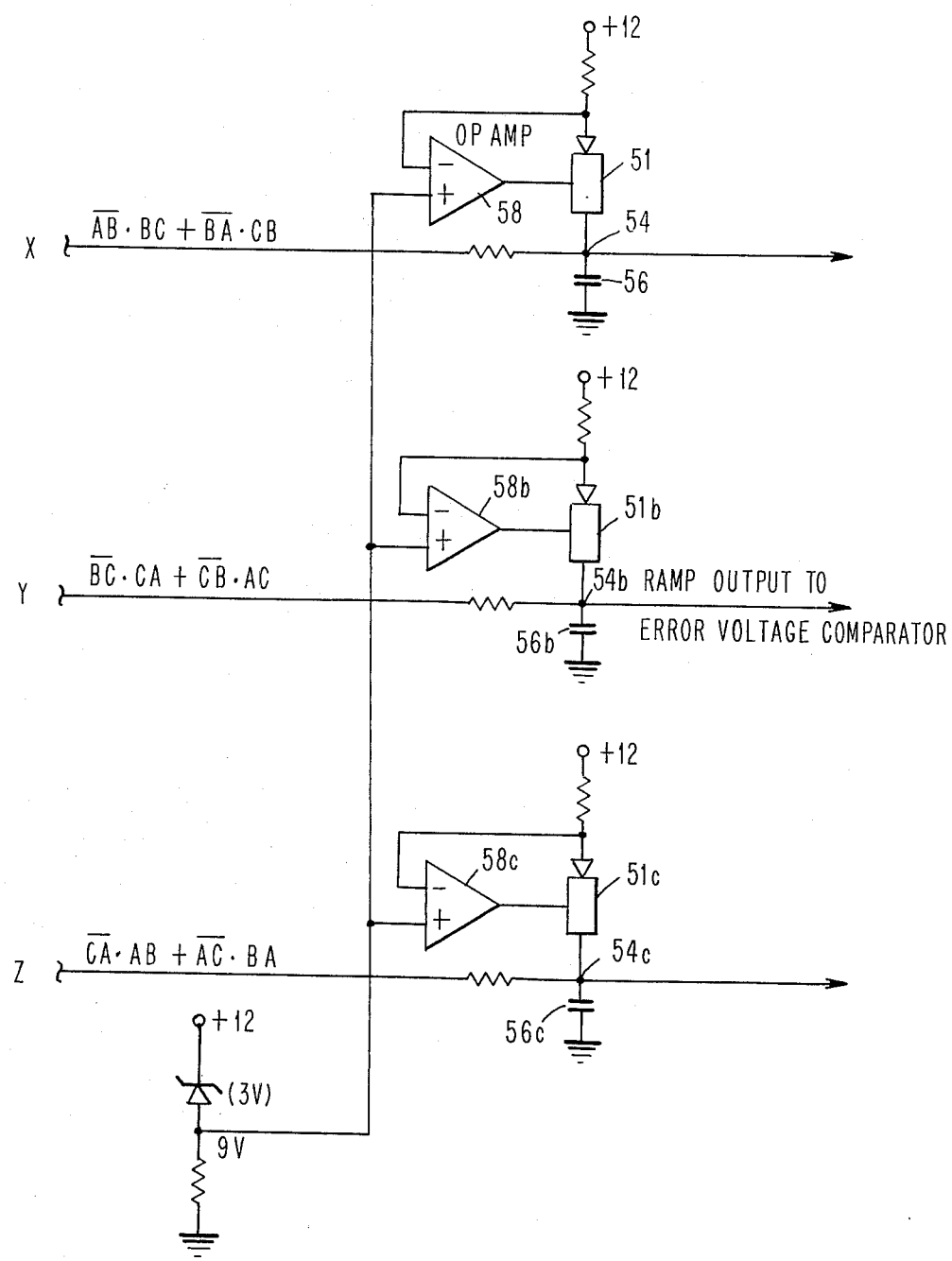
FIG. 7 is a schematic diagram showing the ramp generator for each output of the logical circuit.

The ramp release and reset pulses for generating ramps X, Y and Z are shown as the inputs to the ramp generators as shown in FIG. 7. Each ramp generator is identical and include a PNP type transistor 51 and an operational amplifier (OP AMP) 58 on the base input thereto. As the ramp release and reset generating pulse waveform arrives at the junction 54 connecting the collector of the transistor 51 to the capacitor 56, the positive excursion of the pulse allows the capacitor 56 to charge. The capacitor voltage will rise linearly on the output of junction 54 connecting the collector of the transistor 51 to the capacitor 56, the positive excursion of the pulse allows the capacitor 56 to charge. The capacitor voltage will rise linearly on the output of junction 54 until the input waveform falls causing capacitor 56 to discharge back through the input line. The linear varying voltage ramp output is connected to the error voltage comparator (not shown) where a comparison of the ramp and the error voltage is made to produce the gate to the SCR device, thereby, controlling the voltage output of the regulator.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A ramp release and reset circuit for a three phase system comprising:
 a pair of comparators for each phase of the three phase input to the system for generating two, 180° out of phase timing pulses for each phase;
 a voltage offset means associated with each comparator which raises the comparator switching point above the zero crossover point on each phase input;
 a logic circuit driven by predetermined combinations of the 180° out of phase timing pulses from each of said pair of comparators to produce output timing pulses at each output of said logic circuit in accordance with the logic in said logic circuit;
 linear ramp generators, one associated with each of said logic circuit outputs to generate linear ramps released and reset by the beginning and end, respectively, of each of said output timing pulses from each of said logic circuit outputs.

2. A ramp release and reset circuit according to claim 1, wherein said logic circuit contains three parallel sections having identical logic functions, one for each phase of the three phase input.

3. A ramp release and reset circuit according to claim 2, wherein said three parallel sections of said logic circuit each perform the same predetermined logic function, the first section performs the function on the two, 180° out of phase timing pulses for the first and second phase, the second section performs the function on the two, 180° out of phase timing pulses for the second and third phases and the third section performs the function on the two, 180° out of phase timing pulses for the third and first phase.

4. A ramp release and reset circuit according to claim 3, wherein each parallel section of said logic circuit includes a pair of invert circuits, one for each 180° out of phase timing pulse from the associated pair of comparators, a pair of NAND circuits for logically combining the output of one of said invert circuits with one of the out of phase timing pulses from the next successive phase and a further NAND circuit for combining the outputs of said pair of NAND circuits.

5. A ramp release and reset circuit according to claim 3, wherein the first section of said three parallel sections of said logic circuit forms the logic functions according to the equation $\overline{AB}.BC + \overline{BA}.CB$ wherein AB and BA represent the two, 180° out of phase timing pulses for the first phase and BC and CB represent the two, 180° out of phase timing pulses for the second phase.

6. A ramp release and reset circuit according to claim 5, wherein the second section of said three parallel sections of said logic circuit performs the logic function according to the equation $\overline{BC}.CA + \overline{CB}.AC$ wherein BC and CB represent the two, 180° out of phase timing pulses for the second phase and CA and AC represent the two, 180° out of phase timing pulses for the third phase.

7. A ramp release and reset circuit according to claim 6, wherein the third section of said three parallel sections of said logic circuit performs the logic function according to the equation $\overline{CA}.AB + \overline{AC}.BA$ wherein CA and AC represent the two 180° out of phase timing pulses for the third phase and AB and BA represent the two, 180° out of phase timing pulses for the first phase.

8. A ramp release and reset circuit according to claim 1, wherein said output timing pulses for each logic circuit output generated according to said predetermined logic function have a rising edge and a falling edge determined in accordance with the input phase wave crossing said offset voltage on the positive side of said wave as it approaches zero crossover.

9. A ramp release and reset circuit according to claim 1, wherein said linear ramp generator, one associated with each of said logic circuit outputs, is released at approximately 12° prior to ZCO and resets at approximately 108° to prevent overlap.

* * * * *